United States Patent [19]

Houtermans et al.

[11] 4,092,170

[45] May 30, 1978

[54] PHOTOCOPYING MATERIALS

[75] Inventors: Antonius H. I. Houtermans; Johannes G. Kamphuis, both of Venlo, Netherlands

[73] Assignee: Oce-van der Grinten N.V., Venlo, Netherlands

[21] Appl. No.: 658,473

[22] Filed: Feb. 17, 1976

[30] Foreign Application Priority Data

Feb. 25, 1975 United Kingdom ............... 07920/75

[51] Int. Cl.$^2$ .......................... G03C 1/52; G03F 7/02; G03C 1/64; G03C 1/68

[52] U.S. Cl. ...................................... 96/91 R; 96/33; 96/75; 96/115 R

[58] Field of Search ................... 96/75, 91, 115 R, 33

[56] References Cited

U.S. PATENT DOCUMENTS

| | | | |
|---|---|---|---|
| 3,679,419 | 7/1972 | Gillich | 96/75 |
| 3,751,257 | 8/1973 | Dahlman | 96/75 |
| 3,790,382 | 2/1974 | Dahlman | 96/75 |
| 3,790,556 | 2/1974 | Doggett | 96/75 |
| 3,847,614 | 11/1974 | Mattor | 96/75 |

FOREIGN PATENT DOCUMENTS 1,280,885   7/1972   United Kingdom ..................... 96/75

*Primary Examiner*—Mary F. Kelley
*Attorney, Agent, or Firm*—Albert C. Johnston

[57] ABSTRACT

A photocopying material is provided having a light-sensitive layer comprising an oleophilic resin and a resinous diazonium compound, which both are soluble in an organic solvent but substantially insoluble in water, in admixture with a surface active agent which, after imagewise exposure, renders the layer developable with plain water such as ordinary tap water so as to yield an excellent photocopy and in particular a printing form from which many thousands of fine prints can be made on an offset machine.

21 Claims, No Drawings

PHOTOCOPYING MATERIALS

This invention relates to photocopying materials and especially to lithographic printing plates. In particular this invention relates to photocopying materials comprising negative working diazonium compounds such that when exposed under a negative transparent original followed by treatment with a suitable developer, the photocopying materials yield a positive copy of the negative original.

Photocopying materials, in particular lithographic printing plates, the light-sensitive layer of which consists of a resinous, light-sensitive, negative working diazonium compound, for example the condensation product of a diazonium compound, such as e.g. a diazodiphenyl amine, and a compound containing a reactive carbonyl group, such as e.g. formaldehyde, which is soluble in water but substantially insoluble in organic solvents are known. Such light-sensitive layers can be developed with plain water which has many advantages and, therefore, are considered highly desirable.

However light-sensitive layers which substantially consist of water-soluble resinous diazonium compounds have the drawback that the image parts of copies produced therewith have only a very moderate abrasion resistance. When such layers are, for example, applied on lithographic printing plates this means that with the photocopies produced therewith, the so-called printing forms, only a relatively low number of prints can be made.

To improve the abrasion resistance of the image parts of such copies it has been proposed to give them an after-treatment with a so-called reinforcing laquer or to incorporate a reinforcing lacquer into the light-sensitive layer. It has further been proposed to improve such latter light-sensitive layers by replacing the water-soluble resinous diazonium compound by a resinous diazonium compound which is insoluble, or only sparingly soluble, in water but which is readily soluble in many of the common organic solvents. This has the advantage that homogeneous coating compositions which comprise the light-sensitive diazonium compound and the reinforcing oleophilic resin completely dissolved in an organic solvent medium can be prepared without difficulty. Such coating compositions, when coated onto a suitable carrier, yield light-sensitive layers in which the diazonium compound and the resin are in a desirable uniform admixture with each other.

Photocopying materials having a light-sensitive layer comprising an oleophilic, solvent-soluble resin and an organic solvent-soluble, sparingly water-soluble light-sensitive resinous diazonium compound are e.g. described in British patent specification No. 1,280,885 and the specification of Dutch patent application No. 7410806. According to British patent specification No. 1,280,885 the organic solvent-soluble, sparingly water-soluble light-sensitive resinous diazonium compound (hereinafter called a diazonium resin salt) is obtained by reacting a water-soluble, light-sensitive resinous condensation product of a diazonium compound and a compound containing a reactive carbonyl group with certain uncondensed organic compounds such as e.g. an acidic aliphatic or aromatic compound or a hydroxyl group containing aromatic compound. According to the specification of Dutch Patent Application No. 7410806 the light-sensitive diazonium resin salt is obtained by reacting a water-soluble light-sensitive resinous condensation product of a diazonium compound and a compound containing a reactive carbonyl group with a complex, halogen containing inorganic acid.

Although being advantageous in many respects, such light-sensitive layers have the drawback that they can no longer be developed with plain water. For a development which is sufficiently selective and can be effected within a reasonable time they require the use of an aqueous developer which comprises at least a substantial quantity of a surface active agent, which in some cases has to be as high as 20%. Further in most instances the developer should also comprise a substantial amount of a selective organic solvent and/or an aromatic sulphonic acid.

According to the present invention there is provided photocopying material comprising a support and a light-sensitive layer which comprises a negative-working, light-sensitive diazonium resin salt and an oleophilic, filmforming resin, both of which are soluble in organic solvents and sparingly soluble in water, and at least 10% by weight of a water-soluble surface active agent which renders the diazonium resin salt soluble in water.

The light-sensitive layers of the photocopying material according to the invention can be developed with plain water, which can be either distilled or even ordinary tap-water. Thus no special developer need be acquired, prepared and/or kept in storage. The development itself can be effected by merely directing a stream of water from a tap on to the exposed layer or by rubbing the exposed layer with a pad soaked with water. There is no need for the operator to handle hazardous material and any possible harm to the environment is reduced to a considerable extent and has become practically negligible.

The light-sensitive layers according to this invention are especially suitable for the production of lithographic printing plates. However they can also be used for making e.g. colourproofs, visual aids and printed circuits.

The negative-working light-sensitive diazonium resin salt used in the present invention may be one of those described in British patent specification No. 1,280,885 or the specification of Dutch Patent Application No. 7410806. Some specific examples of diazonium resin salts which may be used are the p-toluene sulphonic acid salt of the condensation product of p-diazodiphenylamine and formaldehyde, as well as the sulphonic acid 1-chloro-4-benzene salt and the $BF_4$ salt of this condensation product. The naphthalene-2-sulphonic acid salt thereof is particularly useful.

The oleophilic filmforming resins to be used in the light-sensitive layer of the invention can be one of those known to the man skilled in the art to be useful for this purpose such as e.g. those described in British patent specification No. 1,280,885 and the specification of Dutch Patent Application No. 7410806. Resins which give satisfactory results, especially on lithographic printing plates, are e.g. found amongst the phenolic-aldehydes, polyvinylchlorides and polyvinylacetates. Especially good results are obtained with Epon type resins, such as those produced by Shell under the trade names Epon 1031, 1006 and 1001.

The surface active agent (hereinafter for brevity referred to as surfactant) used in the light-sensitive layers of the present invention may for example be selected in the following way.

An approximately 5% by weight aqueous solution of the surfactant to be tested for its applicability is prepared. (The surfactants which are soluble in water are usually known to the man skilled in the art or otherwise can be looked up in one of the many relevant handbooks such as e.g. McCutcheon's Detergents and Emulsifiers, North American Edition, 1973 Annual). To some 95 p.p.w. of the surfactant solution are added some 5 p.p.w. of the diazonium resin salt which has been chosen as light-sensitive compound for the light-sensitive layer of a copying material according to the invention. If the diazonium resin salt dissolves in the aqueous testing solution a light-sensitive layer which comprises an oleophilic film-forming resin together with the surfactant and the diazonium resin salt so tested will be developable with plain water, whereas if the diazonium resin salt is not soluble in the aqueous testing solution the light-sensitive layer will not be developable with plain water.

It has been found that, in general, if a surfactant renders a certain diazonium resin salt soluble in water, this surfactant will render all or almost all sparingly water soluble diazonium resin salts of the types referred to in British patent specification No. 1,280,885 and the specification of Dutch Patent Application No. 7410806 soluble in water. For the sake of safety however it is preferred that the surfactant is tested with the particular diazonium resin salt which is going to be used in the light-sensitive layer of the photocopying material of the invention.

The above described test has been found very reliable in giving highly reproducible results. Further although the above given concentrations are not very critical, if they are departed from too far, e.g. by doubling the concentration of the surfactant, no practical purpose is served and the reliability of the test may even be negatively affected.

The surfactants used in the present invention are suitably water-soluble cationic surfactants, such as for example Arquad C, an alkyl-quaternary ammonium salt of the general formula

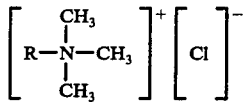

(in which the hydrocarbon chain R for the major part consists of 12 (some 47%) and 14 (some 18%) carbon atoms), and Ethomeen S 25, a compound with the general formula

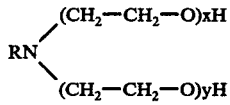

(in which R is an alkyl group which for the major part has 18 carbon atoms in the chain and $x + y$ together make 15).

Especially suitable are water-soluble-quaternary ammonium salts of the formula I, in which the chloride ion may also be replaced by another simple anion such as $HSO_4^-$, $Br^-$ or the like, and R has on average 16–18 carbon atoms such as e.g. Arquad T and Arquad 18 which are also marketed by Armour Chemical Company.

Also very useful are quaternary ammonium salts of the general formula

(wherein $R_1$ and $R_2$ are hydroxy-substituted alkyl groups such as methylol or ethylol, $R_3$ is H or a hydroxy-substituted alkyl group such as methylol or ethylol and $R_4$ is an alkyl chain with 9 to 18 carbon atoms). Examples of such compounds which give good results are Maprofix 2109, a diethanolamine dodecylsulphate produced by Onyx Chemical Company and Standapol T, a triethanol amine dodecylsulphate from Standard Chemical Products, Inc.

Suitable anionic surfactants for use in the present invention include sodium laurylsulphate, sodium-2-ethyl laurylsulphate and sodium tridecyl laurylsulphate.

Although in general non-ionic surfactants were found to be less suitable or not suitable at all for use in the light-sensitive layers according to the invention, polyvinylpyrrolidone, surprisingly, was found to be exceptionally useful. When a polyvinylpyrrolidone such as e.g. Luviskol K 30 and especially PVP K 90, both non-ionic surfactants the first produced by Badische Anilin and Soda Fabriken, Germany, and the other by G.A.F. was used, water developable light-sensitive layers could be made with a substantially higher percentage of oleophilic resin than when any of the other, anionic or cationic surfactants tested were used. This is especially advantageous for lithographic printing plates since with increasing percentages of resin in the light-sensitive layers thereof generally increasing numbers of prints can be obtained.

The 10% by weight minimum of surfactant in the light-sensitive layer of the photocopying material according to the invention will generally give satisfactory results as regards the time required for and the selectivity obtainable with the development of that layer. However it may be advantageous, e.g. for further increasing selectivity and speed of development, to have as much as 20–40% by weight of surfactant present in the light-sensitive layer. Even if as much as 40% by weight of surfactant is present in the layer, pollution of the environment by the effluent water resulting from the development will still be only a fraction of that resulting from development with the presently used type of developer containing 10–20% of a surfactant as is shown by the following calculation.

To develop a lithographic printing plate of the usual commercial type having a light-sensitive layer of approximately 1 g/m² composed of a diazonium resin salt and oleophilic resin, on average 20 g developer comprising at least 2 g (10% by weight) of a surfactant per A4 size plate are required. A light-sensitive layer of approximately 1 g/m² of a lithographic printing plate according to the invention which comprises 40% by weight of a surfactant contains 0.4 g of surfactant per m² or approximately 0.04 g per A4 size plate. The amount of surfactant in such a plate, therefore, is only 2% of that required for the development of the conventional printing plate.

For a given desired development time and selectivity the amount of surfactant required in the light-sensitive layer of the photocopying material of the invention will also depend on the proportion of diazonium resin salt and oleophilic resin in the layer. With increasing percentages of oleophilic resin increasing percentages of surfactant will generally be required to achieve the desired development speed and selectivity. In the case of lithographic plates good results in respect of developability and number of obtainable copies are obtained with light-sensitive layers which contain the diazonium resin salt and oleophilic filmforming resin in proportions between approximately 4 : 1 and 1 : 3 by weight and between approximately 30 to 40% by weight of surfactant, calculated on the weight of dry matter.

The weight per square meter of the light-sensitive layer of the photocopying materials according to the invention depends on the intended purpose of the copying material and is known to the man skilled in the art. For lithographic printing plates the weight of the light-sensitive layer generally lies between 0.5 – 2.5 g/m². A preferred range is from about 0.75 to 1.5 g/m².

As support of the photocopying materials of the invention any of the base materials known in the art may be used such as paper, metal plate or synthetic sheet material, especially Mylar. For lithographic printing aluminium plates or sheets are the generally preferred supports. It may be advantageous to give the aluminum support one or more of the treatments known in the art, such as graining or an electrolytical treatment, to improve the strength of the light-sensitive layer coated thereon.

The photocopying materials of the invention may be prepared by applying to a suitable support a coating composition which comprises, dissolved in a suitable organic solvent, a negative-working light-sensitive diazonium resin salt, an oleophilic filmforming resin both being soluble in organic solvents but sparingly soluble in water and at least 10% by weight, calculated on the quantity of diazonium resin salt plus oleophilic resin, of a water-soluble surfactant which renders the diazonium resin salt soluble in water. Conventional coating processes and organic coating liquids may be used for this purpose. Such processes are for example described in the above mentioned British patent specification No. 1,280,885 and the specification of Dutch Patent Application No. 7410806. Suitable coating liquids are for example dimethylformamide, N-methylpyrrolidone and furfurylalcohol. Preferably however methylene glycol is used as the solvent for preparing the coating compositions according to this invention. In some cases it is preferred to add a few percent, e.g. 10–20%, of water to the organic solvent. The thickness of the coated layer mainly depends on the concentration of the coating solution and the mechanical means by which it is applied to the support material. The principles hereof are known to the man skilled in the art.

If the above described process is used to produce the photocopying material according to the invention care should be taken to select a surfactant which, besides to water, also is soluble in the organic solvent of the coating composition. The cationic surfactants named hereinbefore in general are soluble in the above named coating solvents to a sufficient extent to enable them to be incorporated into the coating composition. In some cases, however, and in most cases when an anionic surfactant is used, it is advantageous to add a few percent of a co-solvent for the surfactant to the coating composition. In general lower alcohols having 5–7 carbon atoms in the molecule may be used for this purpose. The co-solvent to be used preferably should have a boiling point as close as possible to that of the solvent used for the coating composition. For example when Methyl Cellosolve (a trade name for methylene glycol produced by Union Carbide Corporation) which has a boiling point of approximately 130° C is used as the organic solvent for the coating composition, 3-pentanol (b.p. 115° C), 2-methyl-1-butanol (b.p. 129° C) and especially 4-methyl-2-pentanol (b.p. 130° C) may be used as co-solvent. When N-methylpyrrolidone (b.p. 200° C) is used as coating solvent, benzyl alcohol (b.p. 202° C) may suitably be used as co-solvent. Generally the presence of 3–5% of co-solvent in the coating composition is sufficient to give the desired improved solubility of the surfactant in the coating composition.

According to another process for preparing the photocopying materials according to the invention, a layer is coated on to a suitable support by applying an organic solvent coating solution which only contains the light-sensitive diazonium resin salt and the oleophilic filmforming resin. After this layer has thoroughly been dried and allowed to harden the surfactant is coated thereon from an aqueous solution. This process is especially useful for applying a surfactant which is very satisfactory as regards its water-solubility and its ability to render the diazonium resin to be used soluble in water, but which is insufficiently soluble in the organic solvents in which the other two components can be dissolved. Examples of such surfactants are sodium dodecyl sulphate, sodium-2-ethyl-dodecyl sulphate, sodium decyl sulphate and sodium tridecyl sulphate.

When this second process is used the surfactant, after evaporation of the water, is distributed throughout the upper part of the layer on to which it has been coated. It appears (though this has not been confirmed) that the upper part of the initially coated layer is slightly weakened by the aqueous coating solution applied thereon, thereby permitting the surfactant to penetrate therein and becoming fixed after the layer has become dry and solid again.

The invention is further illustrated in the following Examples.

EXAMPLE 1

A coating composition was prepared by first dissolving 1.25 g Epon 1001 in 90 ml methyl Cellosolve. To this solution 7 ml water were added together with 3.75 g of the light-sensitive reaction product of an approximately equimolecular condensation product of p-diazo-diphenylamine and p-formaldehyde (a product marketed by Andrews Paper and Chemical Co. Inc. under the trade name of Diazo litho A) with naphthalene-2-sulphonic acid.

When this diazo resin salt has been completely dissolved 3 g surfactant, Maprofix 2109, together with 3 ml 4-methyl-2-pentanol as co-solvent for the surfactant were dissolved in the mixture. The composition so obtained was then coated with a rod 0.25 on to an aluminum sheet, which previously had been roughened, cleaned, degreased and silicated in known matter, to obtain a light-sensitive layer of approximately 1.2 g/m², after drying at 80° C for 5 min.

The light-sensitive lithographic printing plate prepared in this way was exposed to ultraviolet light for about 3 minutes through a transparent negative and developed by treatment for 2 minutes with a pad soaked in ordinary tap-water. With the resulting printing form more than 10,000 excellent copies could be made without signs of any kind of degradation becoming visible.

EXAMPLE 2

In substantially the same way as described in Example 1 a light-sensitive coating composition was prepared comprising 4.5 g of the $BF_4^-$ salt of Diazo litho A as the light-sensitive diazonium resin salt, 1.5 g Epon 1006 as the oleophilic filmforming resin and 5 g Arquad T as the surfactant. No co-solvent was required in this case. With this coating composition a printing plate was produced having a light-sensitive layer of approximately 1 g/m².

After exposure the plate could simply be developed by directing a stream of water from an ordinary tap on to the plate to give a printing form with which thousands of excellent copies could be made.

EXAMPLE 3

In 90 ml methyl Cellosolve were dissolved 1.25 g Epon 1031. To this solution 7 ml water and 3.75 g of the 1-chloro-4-benzene sulphonic acid salt of the condensation product of formaldehyde and 1-diazo-2,5-dimethoxy-4-(p-toluylthio)-benzene as the light-sensitive diazonium resin salt were added and completely dissolved therein.

This coating composition was coated with a rod 0.25 on to an aluminium sheet pretreated in known manner, and dried for 5 minutes at 80° C to give a printing plate with a light-sensitive layer of approximately 0.9 g/m². After the layer had been allowed to harden thoroughly, a 10% by weight aqueous solution of sodium dodecylsulphate was coated thereon and dried with a fan. In this way approximately 1 g/m² of the surfactant was taken up into the light-sensitive layer, becoming homogeneously distributed in the upper part of the light-sensitive layer.

After exposure under a negative transparency for 2 minutes the layer could readily be developed, either by directing a stream from an ordinary water-tap on to it or by treatment with pad soaked in ordinary tap-water, to give an excellent printing form allowing more than 10,000 copies to be produced therefrom without showing any signs of degradation.

EXAMPLE 4

In 80 ml methyleneglycol 2.5 g Epon 1031 were dissolved. To this solution 7 ml water and 2.5 g of the reaction product of an approximately equimolecular condensation product of p-diazo-diphenylamine and p-formaldehyde (as mentioned in Example 1) with naphthalene-2-sulphonic acid were added.

After the diazo resin salt had completely been dissolved 5.3 g PVP K 90 (a polyvinylpyrrolidone of a mol. wt. of approximately 700.000, marketed by General Aniline and Film) were dissolved in the mixture. No co-solvent was required in this case which is another advantage of the use of polyvinylpyrrolidone as surfactant.

The composition so obtained was coated with a rod 0.25 on to an aluminium sheet which had been pretreated in the way indicated in Example 1.

After drying at 80° C for some 5 minutes a light-sensitive layer was obtained of approximately 1.5 g per square meter.

After exposure through a transparent negative the layer could be developed by treatment for some 3 minutes with a pad soaked in ordinary tap-water.

With the resulting printing form several thousands of excellent copies could be made without any signs of wear of the image parts of the printing form becoming visible.

What is claimed is:

1. Photocopying material comprising a support carrying a light-sensitive layer which consists essentially of a negative-working, light-sensitive diazonium resin salt and an oleophilic, filmforming resin, both of which are soluble in organic solvents and at most sparingly soluble in water, and at least 10% by weight of water-soluble surfactant which renders said diazonium resin salt soluble in water so that said layer is developable into an image by plain water after imagewise exposure of said layer to light;

said resin salt being selected from the group consisting of p-toluene sulfonic acid, napththalene-2-sulfonic acid, BF4- and 1-chloro-4-benzene sulfonic acid salts of the condensation product of p-diazo-diphenylamine and formaldehyde;

said surfactant being selected from the group consisting of:

a. alkyl-quaternary ammonium salts of the general formula

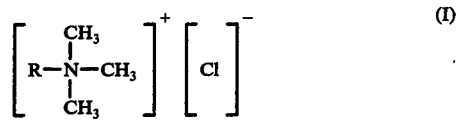 (I)

in which R represents a hydrocarbon chain, which salts comprise predominantly at least one compound of formula I wherein R is an alkyl chain having 12 to 18 carbon atoms;

b. ethylene oxide amines of the general formula

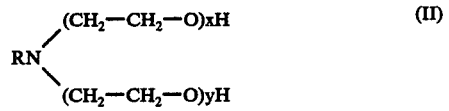 (II)

R represents an alkyl chain, which amines comprise at least one compound of formula II wherein the alkyl chain has 18 carbon atoms and the sum of x and y is 15;

c. water-soluble quaternary ammonium salts of the general formula

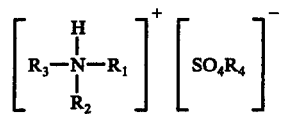

wherein $R_1$ and $R_2$ each is a methylol or ethylol group, $R_3$ is hydrogen or a methylol or ethylol group, and $R_4$ is an alkyl chain having 9–18 carbon atoms;

d. sodium and sodium-2-ethyl dodecyl sulfates, sodium decyl sulfate and sodium tridecyl sulfate; and e. polyvinyl pyrrolidone surfactants.

2. Photocopying material according to claim 1, comprising in the light-sensitive layer as said surfactant water-soluble alkyl-quaternary ammonium salt of the general formula

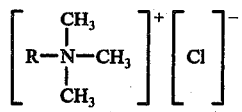

in which R is a hydrocarbon chain, which salt comprises predominantly at least one compound of said formula wherein R is an alkyl group having 12 to 18 carbon atoms.

3. Photocopying material according to claim 1 comprising in the light-sensitive layer as said surfactant water-soluble quaternary ammonium salt of the general formula

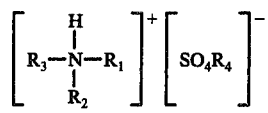

wherein $R_1$ and $R_2$ each is a methylol or ethylol group, $R_3$ is H or a methylol or ethylol group, and $R_4$ is an alkyl chain having 9-18 carbon atoms.

4. Photocopying material according to claim 3 comprising in the light-sensitive layer as said surfactant diethanolamine laurylsulphate or triethanol amine laurylsulphate.

5. Photocopying material according to claim 1 comprising in the light-sensitive layer as said surfactant a polyvinylpyrrolidone.

6. Photocopying material according to claim 1 comprising in the light-sensitive layer 30-40 wt % of said surfactant.

7. Photocopying material according to claim 1 comprising in the light-sensitive layer as said diazonium resin salt the naphthalene-2-sulphonic acid salt of the condensation product of p-diazo-diphenylamine and formaldehyde.

8. Photocopying material according to claim 1 comprising in the light-sensitive layer as said oleophilic resin an epoxy resin.

9. Light-sensitive composition for the production of photocopy material, consisting essentially of a solution in an organic solvent of a negative-working light-sensitive diazonium resin salt and an oleophilic filmforming resin, each of which is soluble in organic solvents and at most sparingly soluble in water, and at least 10% by weight, calculated on the dissolved dry matter, of water-soluble surfactant which renders said diazonium resin salt soluble in water, said resin salt being selected from the group consisting of p-toluene sulfonic acid, napthhalene-2-sulfonic acid, BF4-and 1-chloro-4-benzene sulfonic acid salts of the condensation product of p-diazo-diphenylamine and formaldehyde;

said surfactant being selected from the group consisting of:

a. alkyl-quaternary ammonium salts of the general formula

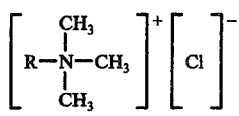 (I)

in which R represents a hydrocarbon chain, which salts comprise predominantly at least one compound of formula I wherein R is an alkyl chain having 12 to 18 carbon atoms;

b. ethylene oxide amines of the general formula

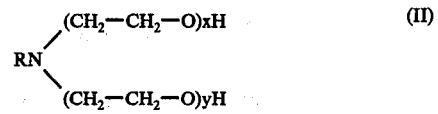 (II)

in which R represents an alkyl chain, which amines comprise at least one compound of formula II wherein the alkyl chain has 18 carbon atoms and the sum of $x$ and $y$ is 15;

c. water-soluble quaternary ammonium salts of the general formula

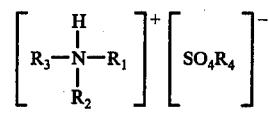

wherein $R_1$ and $R_2$ each is a methylol or ethylol group, $R_3$ is hydrogen or a methylol or ethylol group and $R_4$ is an alkyl chain having 9-18 carbon atoms;

d. sodium and sodium-2-ethyl dodecyl sulfates, sodium decyl sulfate and sodium tridecyl sulfate; and e. polyvinyl pyrrolidone surfactants.

10. Light-sensitive coating composition according to claim 9, further comprising several percent of a co-solvent for the surfactant.

11. Light-sensitive coating composition according to claim 10 comprising an alcohol having 5-7 carbon atoms in the molecule as said co-solvent.

12. Light-sensitive coating composition according to claim 10 comprising 4-methyl-2-pentanol as said co-solvent.

13. Photocopying material for producing an offset printing plate, comprising a support carrying a light-sensitive layer consisting essentially of negative-working light-sensitive diazonium resin salt selected from the group consisting of naphththalene-2-sulfonic acid, BF4- and 1-chloro-4-benzene sulfonic acid salts of the condensation product of p-diazodiphenylamine and formaldehyde, oleophilic filmforming epoxy resin and at least 10% by weight of water-soluble surfactant that renders said resin salt soluble in water, said resin salt and said epoxy resin being present in a weight ratio, resin salt to resin, of between 0.3 and 4 to 1, the quantity of said surfactant being sufficient to render said layer developable into an image by plain water after imagewise exposure of said layer to light, said surfactant being selected from the group consisting of:

a. alkyl-quaternary ammonium salts of the general formula

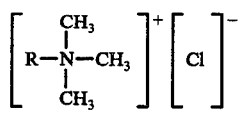 (I)

in which R represents a hydrocarbon chain, which salts comprise predominantly at least one compound of formula I wherein R is an alkyl chain having 12 to 18 carbon atoms;

b. ethylene oxide amines of the general formula

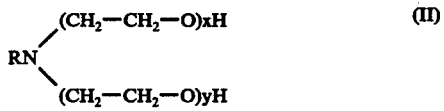

in which R represents an alkyl chain, which amines comprise at least one compound of formula II wherein the alkyl chain has 18 carbon atoms and the sum of $x$ and $y$ is 15;

c. diethanolamine and triethanolamine dodecyl sulfates;

d. sodium and sodium-2-ethyl dodecyl sulfates, sodium decyl sulfate and sodium tridecyl sulfate; and e. polyvinyl pyrrolidone surfactants.

14. Photocopying material according to claim 13, said layer containing about 30 to 40% by weight of said surfactant.

15. Photocopying material according to claim 13, said light-sensitive layer having been formed by coating and drying on said support a solution of said resin salt, said epoxy resin and said surfactant in a solvent consisting essentially of methylene glycol with up to about 20% by weight of water and a small amount of 2-methyl-1-butanol or 4-methyl-1-pentanol sufficient to aid dissolution of said surfactant.

16. Photocopying material according to claim 15, said resin salt being the naphthalene-2-sulfonic acid salt of said condensation product and said surfactant being a diethanolamine or triethanolamine dodecylsulfate.

17. Photocopying material according to claim 13, said light-sensitive layer having been formed by coating and drying on said support a solution of said resin salt and said epoxy resin in a solvent consisting essentially of methylene glycol with up to about 20% by weight of water and thereafter applying to the dried coating an aqueous solution of said surfactant.

18. Photocopying material according to claim 17, said surfactant being selected from the group consisting of sodium and sodium-2-ethyl dodecyl sulfates, sodium decyl sulfate and sodium tridecyl sulfate.

19. Photoconductive material according to claim 13, said light-sensitive layer having been formed by coating and drying on said support a solution of said resin salt, said epoxy resin and said surfactant in a solvent consisting essentially of methylene glycol with up to 20% by weight of water.

20. Photocopying material according to claim 19, said surfactant being a polyvinyl pyrrolidone surfactant.

21. Photocopying material according to claim 19, said resin salt being the naphthalene-2-sulfonic acid salt of said condensation product and said surfactant being a polyvinyl pyrrolidone surfactant.

* * * * *